(12) United States Patent
Jang et al.

(10) Patent No.: US 10,243,695 B2
(45) Date of Patent: Mar. 26, 2019

(54) APPARATUS AND METHOD FOR RECEIVING SIGNAL IN COMMUNICATION SYSTEM SUPPORTING LOW DENSITY PARITY CHECK CODE

(71) Applicant: Samsung Electronics Co., Ltd., Gyeonggi-do (KR)

(72) Inventors: Min Jang, Gyeonggi-do (KR); Kyung-Joong Kim, Seoul (KR); Jae-Yoel Kim, Gyeonggi-do (KR); Seho Myung, Gyeonggi-do (KR); Seok-Ki Ahn, Gyeonggi-do (KR); Chi-Woo Lim, Gyeonggi-do (KR); Hong-Sil Jeong, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 15/393,202

(22) Filed: Dec. 28, 2016

(65) Prior Publication Data
US 2017/0187491 A1    Jun. 29, 2017

(30) Foreign Application Priority Data
Dec. 28, 2015  (KR) .......................... 10-2015-0187310

(51) Int. Cl.
*H03M 13/00* (2006.01)
*H04L 1/00* (2006.01)
*H03M 13/11* (2006.01)

(52) U.S. Cl.
CPC ....... *H04L 1/0045* (2013.01); *H03M 13/1111* (2013.01); *H03M 13/616* (2013.01)

(58) Field of Classification Search
CPC ............. H04L 1/0045; H03M 13/1111; H03M 13/616
See application file for complete search history.

(56) References Cited

U.S. PATENT DOCUMENTS

| | | | | |
|---|---|---|---|---|
| 7,882,414 B2* | 2/2011 | Choi | .................... | H03M 13/116 714/751 |
| 8,090,101 B2* | 1/2012 | Ye | .......................... | H04L 63/061 380/44 |
| 8,245,115 B2* | 8/2012 | Savin | ................... | H03M 13/114 714/752 |
| 8,358,679 B2* | 1/2013 | Zeitler | ................... | H04B 7/155 375/211 |
| 8,412,260 B2* | 4/2013 | Rave | ..................... | H04L 25/067 370/328 |
| 8,495,119 B2 | 7/2013 | Novichkov et al. | | |
| 8,898,537 B2* | 11/2014 | Gross | ................. | H03M 13/1111 714/758 |

(Continued)

*Primary Examiner* — Esaw T Abraham

(57) ABSTRACT

The present disclosure relates to a pre-5th-generation (5G) or 5G communication system to be provided for supporting higher data rates beyond 4th-generation (4G) communication system such as a long term evolution (LTE). A method includes decoding a codeword corresponding to a preset decoding scheme to detect reliability information of each of codeword bits included in the codeword, wherein at least one of a number of quantization bits and a range of a quantization level used for detecting reliability information in the decoding scheme is determined based on a degree of a node on a bipartite graph of a low density parity check (LDPC) code.

18 Claims, 10 Drawing Sheets

(56) References Cited

U.S. PATENT DOCUMENTS 9,286,154 B2 * 3/2016 Ashikhmin ............. G06F 11/10
2005/0216821 A1 * 9/2005 Harada .............. H03M 13/1102
714/801

* cited by examiner $$H = \begin{bmatrix} 1 & 1 & 1 & 1 & 0 & 1 & 1 & 0 & 0 & 0 \\ 0 & 0 & 1 & 1 & 1 & 1 & 1 & 1 & 0 & 0 \\ 0 & 1 & 0 & 1 & 0 & 1 & 0 & 1 & 1 & 1 \\ 1 & 0 & 1 & 0 & 1 & 0 & 0 & 1 & 1 & 1 \\ 1 & 1 & 0 & 0 & 1 & 0 & 1 & 0 & 1 & 1 \end{bmatrix}$$

APPARATUS AND METHOD FOR RECEIVING SIGNAL IN COMMUNICATION SYSTEM SUPPORTING LOW DENSITY PARITY CHECK CODE

CROSS-REFERENCE TO RELATED APPLICATION(S) AND CLAIM OF PRIORITY

The present application is related to and claims the benefit under 35 U.S.C. § 119(a) of a Korean patent application filed on Dec. 28, 2015 in the Korean Intellectual Property Office and assigned Serial No. 10-2015-0187310, the entire disclosure of which is incorporated herein by reference.

TECHNICAL FIELD

The present disclosure relates to an apparatus and method for receiving a signal in a communication system, and more particularly, to an apparatus and method for receiving a signal in a communication system supporting a low density parity check (LDPC) code.

BACKGROUND

To meet the demand for wireless data traffic, which has increased since deployment of 4th-generation (4G) communication systems, efforts have been made to develop an improved 5th-generation (5G) or pre-5G communication system. Therefore, the 5G or pre-5G communication system is also called a 'beyond 4G network' or a 'post long-term evolution (LTE) system'.

It is considered that the 5G communication system will be implemented in millimeter wave (mmWave) bands, e.g., 60 GHz bands, so as to accomplish higher data rates. To reduce propagation loss of radio waves and increase a transmission distance, a beam forming technique, a massive multiple-input multiple-output (MIMO) technique, a full dimensional MIMO (FD-MIMO) technique, an array antenna technique, an analog beam forming technique, and a large scale antenna technique are discussed in 5G communication systems.

In addition, in 5G communication systems, development for system network improvement is under way based on advanced small cells, cloud radio access networks (RANs), ultra-dense networks, a device-to-device (D2D) communication, a wireless backhaul, a moving network, a cooperative communication, coordinated multi-points (CoMP), reception-end interference cancellation, and the like.

In the 5G system, a hybrid frequency shift keying (FSK) and quadrature amplitude modulation (QAM) modulation (FQAM) and a sliding window superposition coding (SWSC) as an advanced coding modulation (ACM) scheme, and a filter bank multi carrier (FBMC) scheme, a non-orthogonal multiple Access (NOMA) scheme, and a sparse code multiple access (SCMA) scheme as an advanced access technology have been developed.

Firstly, various channel codes have been used in a communication system, and a typical one is an LDPC code.

The LDPC code is an error correction code with encoding and decoding complexity which is really implementable and performance which approaches a theoretical channel capacity. The LDPC code may be designed thereby being suitable for parallel processing and error correction performance of the LDPC code on a channel is good, so the LDPC code are used in various communication systems such as an institute of electrical and electronics engineers (IEEE) 802.11n/ad wireless fidelity (Wi-Fi) communication system, an IEEE 802.16e WiMAX communication system, a digital video broadcasting-satellite-second generation (DVB-S2) communication system which is based on a second generation DVB-S2 standard, a digital video broadcasting-terrestrial-second generation (DVB-T2) communication system which is based on a second generation DVB-T2 standard, a digital video broadcasting-cable-second generation (DVB-C2) communication system which is based on a second generation DVB-C2 standard, an advanced television system committee (ATSC) 3.0 communication system which is based on an ATSC 3.0 standard, a G.hn communication system which is based on a G.hn standard as a home network standard, and/or the like.

Further, the LDPC code allows the faster decoding, so the fifth generation (5G) mobile communication system which requires a relatively high data rate actively considers using the LDPC code for channel coding.

Meanwhile, one of main purposes of the 5G mobile communication is for data transmission of several Gbps. A data rate of the 5G mobile communication will be increased at least ten times compared to the 4G mobile communication supporting data transmission of hundreds of Mbps, so a physical layer of each of a mobile station (MS) and a base station (BS) needs to receive and process more signals during preset unit time.

Meanwhile, the more hardware resources need to be used for increasing data throughput of a receiver. This increased hardware mounted area makes the more power consumption.

So, in a case of implementation of a BS and an MS for a 5G mobile communication, the increase of a hardware mounted area and power consumption can be an important issue which needs to be solved.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide an apparatus and method for receiving a signal in a communication system supporting an LDPC code.

Another aspect of the present disclosure is to propose an apparatus and method for receiving a signal by considering a degree of a variable node in a communication system supporting an LDPC code.

Another aspect of the present disclosure is to propose an apparatus and method for receiving a signal by considering the number of quantization bits used when detecting an LLR in a communication system supporting an LDPC code.

Another aspect of the present disclosure is to propose an apparatus and method for receiving a signal by considering a range of a quantization level used when detecting an LLR in a communication system supporting an LDPC code.

Another aspect of the present disclosure is to propose an apparatus and method for receiving a signal thereby decreasing hardware mounted area in a communication system supporting an LDPC code.

Another aspect of the present disclosure is to propose an apparatus and method for receiving a signal thereby decreasing power consumption in a communication system supporting an LDPC code.

Another aspect of the present disclosure is to propose an apparatus and method for receiving a signal thereby increasing a length of an implementable LDPC code without increasing a hardware mounted area in a communication system supporting an LDPC code.

In accordance with an aspect of the present disclosure, a method for receiving a signal in a receiving apparatus in a communication system supporting a low density parity check (LDPC) code is provided. The method includes decoding a codeword corresponding to a preset decoding scheme to detect reliability information of each of codeword bits included in the codeword, wherein at least one of a number of quantization bits and a range of a quantization level used for detecting reliability information in the decoding scheme is determined based on a degree of a node on a bipartite graph of the LDPC code.

In accordance with another aspect of the present disclosure, a receiving apparatus in a communication system supporting a low density parity check (LDPC) code is provided. The receiving apparatus includes a processor configured to decode a codeword corresponding to a preset decoding scheme to detect reliability information of each of codeword bits included in the codeword, wherein at least one of a number of quantization bits and a range of a quantization level used for detecting reliability information in the decoding scheme is determined based on a degree of a node on a bipartite graph of the LDPC code.

Other aspects, advantages, and salient features of the disclosure will become apparent to those skilled in the art from the following detailed description, which, taken in conjunction with the annexed drawings, discloses exemplary embodiments of the disclosure.

Before undertaking the DETAILED DESCRIPTION below, it can be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith, "as well as derivatives thereof, can mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, it should be noted that like reference numbers are used to depict the same or similar elements, features, and structures.

DETAILED DESCRIPTION

Figures 1, 2:
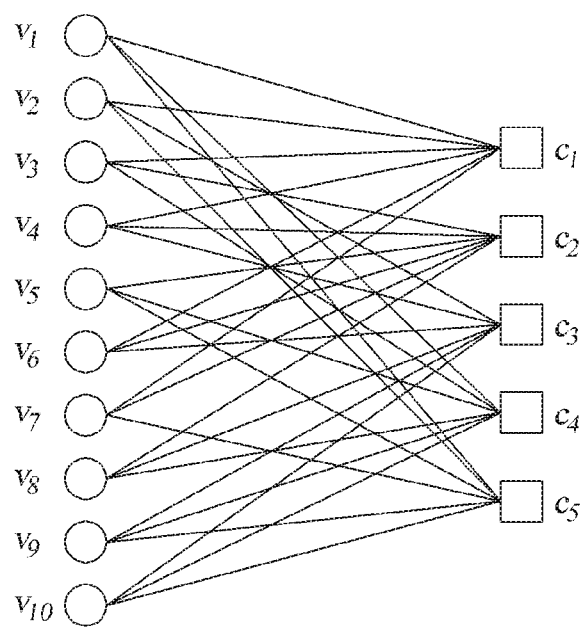
FIG. 1 schematically illustrates a parity check matrix of a (10, 5) LDPC code in a communication system.
FIG. 2 schematically illustrates a bipartite graph corresponding to a parity check matrix of a (10, 5) LDPC code in a communication system.

FIGS. 3 through 11, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged telecommunication devices and services.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Although ordinal numbers such as "first," "second," and so forth will be used to describe various components, those components are not limited herein. The terms are used only for distinguishing one component from another component. For example, a first component may be referred to as a second component and likewise, a second component may also be referred to as a first component, without departing from the teaching of the inventive concept. The term "and/or" used herein includes any and all combinations of one or more of the associated listed items.

The terminology used herein is for the purpose of describing various embodiments only and is not intended to be limiting. As used herein, the singular forms are intended to include the plural forms as well, unless the context clearly indicates otherwise. It will be further understood that the terms "comprises" and/or "has," when used in this specification, specify the presence of a stated feature, number, step, operation, component, element, or combination thereof, but do not preclude the presence or addition of one or more other features, numbers, steps, operations, components, elements, or combinations thereof.

The terms used herein, including technical and scientific terms, have the same meanings as terms that are generally understood by those skilled in the art, as long as the terms are not differently defined. It should be understood that terms defined in a generally-used dictionary have meanings coinciding with those of terms in the related technology.

According to various embodiments of the present disclosure, an electronic device may include communication functionality. For example, an electronic device can be a smart phone, a tablet personal computer (PC), a mobile phone, a video phone, an e-book reader, a desktop PC, a laptop PC, a netbook PC, a personal digital assistant (PDA), a portable multimedia player (PMP), an mp3 player, a mobile medical device, a camera, a wearable device (e.g., a head-mounted device (HMD), electronic clothes, electronic braces, an electronic necklace, an electronic appcessory, an electronic tattoo, or a smart watch), and/or the like.

According to various embodiments of the present disclosure, an electronic device can be a smart home appliance with communication functionality. A smart home appliance can be, for example, a television, a digital video disk (DVD) player, an audio, a refrigerator, an air conditioner, a vacuum cleaner, an oven, a microwave oven, a washer, a dryer, an air purifier, a set-top box, a TV box (e.g., Samsung HomeSync™, Apple TV™, or Google TV™), a gaming console, an electronic dictionary, an electronic key, a camcorder, an electronic picture frame, and/or the like.

According to various embodiments of the present disclosure, an electronic device can be a medical device (e.g., magnetic resonance angiography (MRA) device, a magnetic resonance imaging (MRI) device, computed tomography (CT) device, an imaging device, or an ultrasonic device), a navigation device, a global positioning system (GPS) receiver, an event data recorder (EDR), a flight data recorder (FDR), an automotive infotainment device, a naval electronic device (e.g., naval navigation device, gyroscope, or compass), an avionic electronic device, a security device, an industrial or consumer robot, and/or the like.

According to various embodiments of the present disclosure, an electronic device can be furniture, part of a building/structure, an electronic board, electronic signature receiving device, a projector, various measuring devices (e.g., water, electricity, gas or electro-magnetic wave measuring devices), and/or the like that include communication functionality.

According to various embodiments of the present disclosure, an electronic device can be any combination of the foregoing devices. In addition, it will be apparent to one having ordinary skill in the art that an electronic device according to various embodiments of the present disclosure is not limited to the foregoing devices.

According to various embodiments of the present disclosure, for example, a signal transmitting apparatus or a signal receiving apparatus can be a mobile station (MS). Here, the term signal transmitting apparatus can be interchangeable with the term transmitting apparatus, and/or the like, and the term signal receiving apparatus can be interchangeable with the term receiving apparatus, and/or the like. The term MS can be interchangeable with the term user equipment (UE), device, subscriber station, and/or the like.

According to various embodiments of the present disclosure, for example, a signal transmitting apparatus or a signal receiving apparatus can be a base station (BS). The term BS can be interchangeable with the term node B, evolved node B (eNB), evolved universal terrestrial radio access network (E-UTRAN) node B (eNB), access point (AP), and/or the like.

An embodiment of the present disclosure proposes an apparatus and method for receiving a signal in a communication system supporting a low density parity check (LDPC) code.

An embodiment of the present disclosure proposes an apparatus and method for receiving a signal by considering a degree of a variable node in a communication system supporting an LDPC code.

An embodiment of the present disclosure proposes an apparatus and method for receiving a signal by considering the number of quantization bits used when detecting a log-likelihood-ratio (LLR) in a communication system supporting an LDPC code.

An embodiment of the present disclosure proposes an apparatus and method for receiving a signal by considering a range of a quantization level used when detecting an LLR in a communication system supporting an LDPC code.

An embodiment of the present disclosure proposes an apparatus and method for receiving a signal thereby decreasing hardware mounted area in a communication system supporting an LDPC code.

An embodiment of the present disclosure proposes an apparatus and method for receiving a signal thereby decreasing power consumption in a communication system supporting an LDPC code.

An embodiment of the present disclosure proposes an apparatus and method for receiving a signal thereby increasing a length of an implementable LDPC code without increasing a hardware mounted area in a communication system supporting an LDPC code.

An apparatus and method proposed in various embodiments of the present disclosure can be applied to various communication systems such as a long term evolution (LTE) mobile communication system, an LTE-advanced (LTE-A)

mobile communication system, a licensed-assisted access (LAA)-LTE mobile communication system, a high speed downlink packet access (HSDPA) mobile communication system, a high speed uplink packet access (HSDPA) mobile communication system, a high rate packet data (HRPD) mobile communication system proposed in a $3^{rd}$ generation project partnership 2 (3GPP2), a wideband code division multiple access (WCDMA) mobile communication system proposed in the 3GPP2, a code division multiple access (CDMA) mobile communication system proposed in the 3GPP2, an institute of electrical and electronics engineers (IEEE) 802.16m communication system, an IEEE 802.16e communication system, an evolved packet system (EPS), and a mobile internet protocol (Mobile IP) system, a digital video broadcast system such as a mobile broadcast service such as a digital multimedia broadcasting (DMB) service, a digital video broadcasting-handheld (DVP-H), an advanced television systems committee-mobile/handheld (ATSC-M/H) service, and the like, and an internet protocol television (IPTV), a moving picture experts group (MPEG) media transport (MMT) system and/or the like.

A fixed-point decoding process proposed in an embodiment of the present disclosure can be implemented with the following two schemes.

The first scheme is a scheme in which the number of quantization bits indicting an LLR is variably set according to a degree of a variable node which corresponds to a codeword bit, this will be described below, and a detailed description thereof will be omitted herein. Hereinafter, a scheme in which the number of quantization bits indicting an LLR is variably set according to a degree of a variable node which corresponds to a codeword bit will be referred to as "differential LLR-quantization bit setting scheme".

The second scheme is a scheme in which a range of a quantization level indicting an LLR is variably set according to a degree of a variable node which corresponds to a codeword bit, this will be described below, and a detailed description thereof will be omitted herein. Hereinafter, a scheme in which a range of a quantization level indicting an LLR is variably set according to a degree of a variable node which corresponds to a codeword bit will be referred to as "differential LLR-quantization level setting scheme".

For convenience, it will be assumed that a fixed-point decoding process is, for example, a fixed-point min-sum (FP-MS) decoding process. In an embodiment of the present disclosure, the fixed-point decoding process is the FP-MS decoding process, however, an embodiment of the present disclosure is not limited to the FP-MS decoding process.

A fixed-point decoding process proposed in an embodiment of the present disclosure can be applied to all fixed-point based-decoding processes which use a message with a limited expression range.

For convenience, in an embodiment of the present disclosure, the fixed-point decoding process in a case that an LLR is variably quantized based on a degree of a variable node will be described below. However, an embodiment of the present disclosure is not limited to a case that an LLR is variably quantized based on a degree of a variable node.

So, if a degree of a check node is irregular, an embodiment of the present disclosure can be implemented with a scheme in which an LLR is variably quantized based on a degree of a check node.

For convenience, in a fixed-point decoding process according to embodiment of the present disclosure, uniform quantization will be assumed. However, a fixed-point decoding process according to embodiment of the present disclosure can be applied to non-uniform quantization as well as uniform quantization.

For convenience, in an embodiment of the present disclosure, it will be assumed that each of a type of a variable node and a type of an edge are classified into two types and variably quantized according to a degree in a fixed-point decoding process. However, a fixed-point decoding process according to an embodiment of the present disclosure can be applied to a case that each of the number of types of a variable node and the number of types of an edge is equal to or greater than 3 as well as a case that each of the number of types of a variable node and the number of types of an edge is 2. That is, in an embodiment of the present disclosure, a differential LLR-quantization bit setting scheme and a differential LLR-quantization level setting scheme are described by considering two types of a degree such as a high degree and a low degree. However, a differential LLR-quantization bit setting scheme and a differential LLR-quantization level setting scheme according to an embodiment of the present disclosure can be implemented by considering three or more degree types.

In an embodiment of the present disclosure, a differential LLR-quantization bit setting scheme and a differential LLR-quantization level setting scheme are described by considering all of variable nodes which correspond to a high degree and all of variable nodes which correspond to a low degree. However, the differential LLR-quantization bit setting scheme and the differential LLR-quantization level setting scheme can be implemented by considering a part of all of the variable nodes which correspond to the high degree and a part of all of the variable nodes which correspond to the low degree, not all of the variable nodes which correspond to the high degree and all of the variable nodes which correspond to the low degree.

A fixed-point decoding process according to an embodiment of the present disclosure will be described below.

An important characteristic which occurs in a case that a communication system performs a belief-propagation decoding process on an LDPC code is that an error correction convergence speed of a codeword bit which corresponds to a variable node of a high degree is faster than an error correction convergence speed of a codeword bit which corresponds to a variable node of a low degree. That is, during one iterative decoding, an absolute value of a message value which is input from and output to a variable node of a high degree fastly increases compared to an absolute value of a message value which is input from and output to a variable node of a low degree. Further, a variable node of a high degree inputs reliability information from more check nodes, so the variable node of the high degree has a characteristic which is more robust to an error compared to a variable node of a low degree. This characteristic of an LDPC code is an important characteristic which can identify the LDPC code from a turbo code and a polar code. Here, a high degree denotes a degree which is greater than or equal to a preset threshold degree and a low degree denotes a degree which is less than the preset threshold degree. For convenience, a degree of a variable node will be referred to as "variable node degree".

Meanwhile, in a case that a maximum degree with a sufficient size is set for an LDPC code, variable nodes with a maximum degree among total variable nodes generally occupy a significant percentage. Specially, a percentage of edges connected to the variable nodes with the maximum degree among total edges is determined as a significantly large value.

The LDPC code may be defined based on a parity check matrix including elements which have a value '1' and elements which have a value '0'. The number of rows and the number of columns included in the parity check matrix may be expressed as N and M, respectively. In a case that the LDPC code which may be defined based on the parity check matrix is used, message bits of a length K are generated as the codeword bits of a length N, where K=N−M.

A parity check matrix of a (10, 5) LDPC code in a communication system is described with reference to FIG. 1.

FIG. 1 schematically illustrates a parity check matrix of a (10, 5) LDPC code in a communication system.

Referring to FIG. 1, a parity check matrix H of a (10, 5) LDPC code includes 10 columns and 5 rows. That is, a parity check matrix of a (10, 5) LDPC code in FIG. 1 can be used in a case that a message bit sequence including 5 bits are input and encoded into a codeword bit sequence including 10 bits.

Meanwhile, a decoding process of the LDPC code can be expressed with a message passing process on a bipartite graph which corresponds to a parity check matrix. For example, a parity check matrix including M rows and N columns can be expressed as a bipartite graph including N variable nodes and M check nodes.

Each variable node and each check node are connected to an edge according to a location of an element of which a value is not zero, i.e., a non-zero element, e.g., an element of which a value is 1 in the parity check matrix. For example, if a value of an element which is located at the i-th column and the j-th row of the parity check matrix is 1, the i-th variable node and the j-th check node on the bipartite graph are connected each other.

A bipartite graph corresponding to a parity check matrix of a (10, 5) LDPC code in a communication system is described with reference to FIG. 2.

FIG. 2 schematically illustrates a bipartite graph corresponding to the parity check matrix of the (10, 5) LDPC code in a communication system.

The bipartite graph in FIG. 2 is a bipartite graph corresponding to a parity check matrix of a (10, 5) LDPC code in FIG. 1.

In a parity check matrix, each variable node and each check node are connected to an edge according to a location of a non-zero element. For example, in the parity check matrix of the (10, 5) LDPC code, an element which is located at the first row and the first column is a non-zero element, so the first variable node and the second check node on the bipartite graph of the (10, 5) LDPC code are connected each other.

On the bipartite graph, each variable node corresponds to a codeword bit, and each check node means linear constraint for a codeword bit connected to the check node. Here, a codeword bit denotes each of bits included in a codeword. The check node denotes an equation indicating that a binary-sum of codeword bits corresponding to variable nodes connected to the check node is 0.

So, decoding for an LDPC code includes a message passing process which is based on the linear constraint relation between a variable node and a check node. That is, the message passing process includes a process in which each variable node and each check node calculate and repetitively pass a log-likelihood-ratio (LLR). That is, a receiver can calculate an LLR of each codeword bit from a symbol received through a channel using the message passing process. Here, a decoding process using message passing can be classified into a sum-product algorithm and a min-sum algorithm according to a computing form of a check node.

The degree distribution is determined by a density evolution scheme, a variable node degree of an LDPC code of which a performance is good is generally configured with $d_v$, d, 3, and 2 based on an optimized result. Here, $d_v$ denotes a maximum variable node degree. For example, $d_v$ can be set to an integer which is greater than 3. Further, d denotes a variable node degree which is set to an integer greater than 3 and less than $d_v$. A percentage of variable nodes with a degree d among total variable nodes is relatively small.

So, variable nodes of an LDPC code can be divided into a variable node set including variable nodes with a degree $d_v$ and a variable node set including variable nodes with a degree less than $d_v$.

A parity check matrix of an LDPC code of a code rate 1/2 in a communication system according to an embodiment of the present disclosure will be described with reference to FIG. 3.

Figure 3:
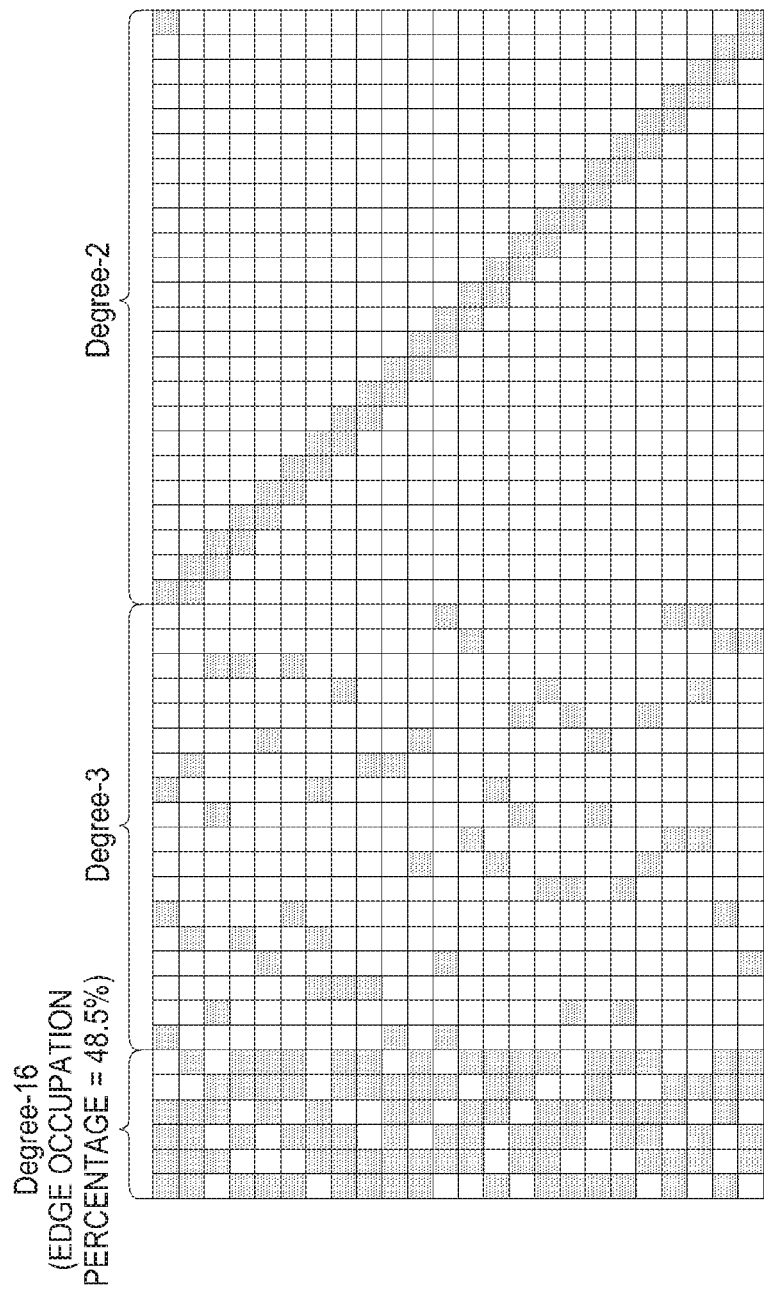
FIG. 3 schematically illustrates a parity check matrix of an LDPC code of a code rate 1/2 in a communication system according to an embodiment of the present disclosure.

FIG. 3 schematically illustrates a parity check matrix of an LDPC code of a code rate 1/2 in a communication system according to an embodiment of the present disclosure.

Referring to FIG. 3, it will be noted that a parity check matrix in FIG. 3 is a parity check matrix of a code rate 1/2 of which a maximum degree is optimized to 16.

In the parity check matrix, 6 variable nodes among total 48 variable nodes have a maximum degree 16. A percentage of edges connected to variable nodes of a degree 16 among total edges is 48.5%, and it will be understood that the percentage of the edges connected to the variable nodes of the degree 16 among total edges is very large.

As described above, a type of a variable node and an edge of an LDPC code is determined based on a characteristic of an LDPC code in an embodiment of the present disclosure, and this will be described below.

Firstly, a type of a variable node is described as follows. The type of the variable node can be determined based on a maximum degree $d_v$, a type of a variable node with a maximum degree $d_v$ is a type-1, and a type of a variable node which does not have the maximum degree $d_v$ is type-2. That is, a variable node which has a maximum degree is a type-1 variable node, and a variable node which does not have the maximum degree is a type-2 variable node.

Secondly, a type of an edge is described as follows. The type of the edge can be determined based on a maximum degree $d_v$, a type of an edge connected to a type-1 variable node is a type-1, and a type of an edge connected to a type-2 variable node is a type-2. That is, an edge connected to the type-1 variable node is a type-1 edge, and an edge connected to the type-2 variable node is a type-2 edge.

In an embodiment of the present disclosure, the number of types of a variable node is 2, and the number of types of an edge is 2. However, the number of types of a variable node can be equal to or greater than 3, and the number of types of an edge can be equal to or greater than 3.

A differential LLR-quantization bit setting scheme according to an embodiment of the present disclosure is described below.

In an embodiment of the present disclosure, the reason why the number of quantization bits indicating an LLR is variably set according to a degree of a variable node which corresponds to a codeword bit is that a convergence speed and robustness to an error of a variable node is varied according to the degree of the variable node.

In a fixed-point decoding process, if a quantization operation is performed on an LLR, a quantization error for a message can occur. More particular, if the number of quantization bits for expressing an LLR of the same range is large, a quantization error decreases. If the number of quantization bits for expressing the LLR of the same range is small, the quantization error increases.

As described above, a variable node with a high degree is robust to an error and has a fast convergence speed, so there is a high probability that the variable node with the high degree can overcome a quantization error even though using quantization bits of which the number is less than the number of quantization bits for a variable node with a low degree in order to express an LLR. However, a variable node with a low degree is weak for an error and a convergence speed of the variable node with the low degree is low, so the variable node with the low degree needs to use quantization bits of which the number is greater than the number of quantization bits for a variable node with a high degree in order to express an LLR to overcome a quantization error.

An embodiment of the present disclosure proposes a scheme in which the number of quantization bits used for quantizing an LLR is variably set according to a degree of a variable node, i.e., a differential LLR-quantization bit setting scheme.

A differential LLR-quantization bit setting scheme according to an embodiment of the present disclosure will be described with reference to FIGS. 4A and 4B.

Figure 4A:
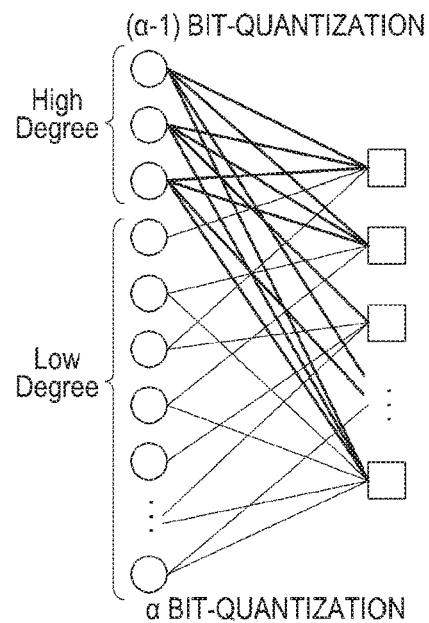
FIGS. 4A and 4B schematically illustrate a differential LLR-quantization bit setting scheme according to an embodiment of the present disclosure.
Figure 4B:
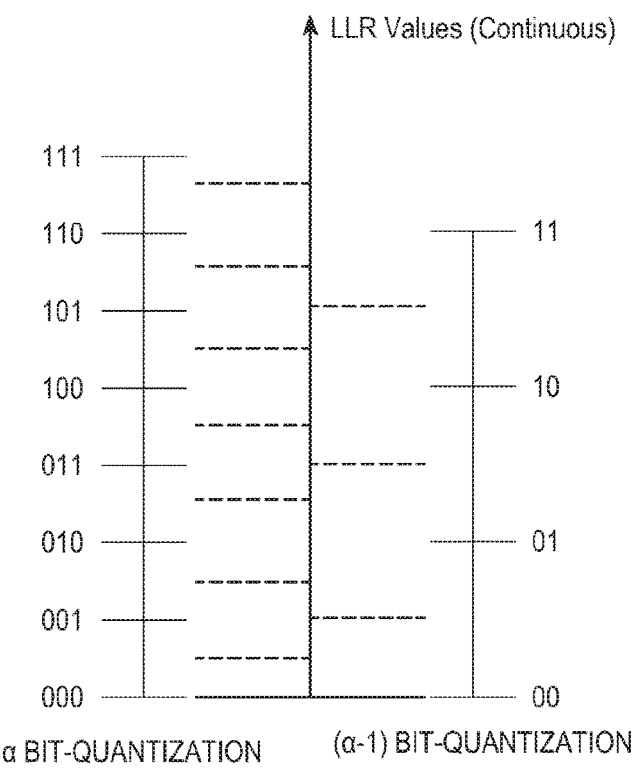

FIGS. 4A and 4B schematically illustrate a differential LLR-quantization bit setting scheme according to an embodiment of the present disclosure.

Referring to FIGS. 4A and 4B, total variable nodes of an LDPC code are classified into type-1 variable nodes and type-2 variable nodes, and total edges of the LDPC code are classified into type-1 edges and type-2 edges.

As shown in FIGS. 4A and 4B, if a quantization bits are used for expressing an LLR for a type-2 variable node and a type-1 edge, bits of which the number is less than $\alpha$, i.e., $\alpha$-$\delta$ bits are used for expressing an LLR for a type-1 variable node and a type-2 edge. In an embodiment of the present disclosure, reliability information is expressed using an LLR, however, any other value can be used for expressing the reliability information as well as the LLR.

For example, in a parity check matrix in FIG. 3, the percentage of type-1 edges is 48.5% of total edges. So, if a scheme of variably setting the number of quantization bits for expressing an LLR proposed in an embodiment of the present disclosure is applied to the parity check matrix in FIG. 3, the number of bits used for expressing an LLR for total edges can be decreased by 0.485$\delta$/$\alpha$.

For example, the quantization for an LLR in a case that $\alpha$ is 3 ($\alpha$=3), and $\delta$ is 1 ($\delta$=1) is shown in FIGS. 4A and 4B. The number of quantization bits for an LLR of a variable node with a low degree is 3, so total $2^3$ LLR quantization values, e.g., 8 LLR quantization values, e.g., 000, 001, 010, 011, 100, 101, 110, and 111 can be expressed. The number of quantization bits for an LLR of a variable node with a high degree is 2, so total $2^2$ LLR quantization values, e.g., 4 LLR quantization values, e.g., 00, 01, 10, and 11 can be expressed.

For example, in a case that a parity check matrix in FIG. 3 is used, $\alpha$ is 6 ($\alpha$=6), and $\delta$ is 1 ($\delta$=1), the number of bits used for expressing an LLR for an edge which can be decreased can be about 8% of bits for expressing an LLR for total edges.

For example, in a case that a parity check matrix in FIG. 3 is used, $\alpha$ is 6 ($\alpha$=6), and $\delta$ is 1 ($\delta$=1), the number of bits used for expressing an LLR for an edge which can be decreased can be about 8% of bits for expressing an LLR for total edges.

In a variable node computing process, the quantization level range which is large $2^q$ times compared to a quantization level range used for expressing an edge is used for preventing an overflow due to an adding computation. Generally, q is set to 2 (q=2) in a communication system. In a case that a differential LLR-quantization bit setting scheme according to an embodiment of the present disclosure is used, the number of bits used for expressing an LLR of a type-1 variable node can be decreased from $\alpha$+q to $\alpha$+q−$\delta$. For example, if $\alpha$ is 6 ($\alpha$=6), $\delta$ is 1 ($\delta$=1), and q is 2 (q=2), the number of bits used for expressing an LLR of a variable node can be decreased from 8 to 7. If the number of bits used for expressing the LLR of the variable node is decreased from 8 to 7, a memory for a variable node computation can be decreased by about 1%.

Since the number of bits used for expressing an LLR of a variable node is variably set, so there is a need for an additional computation in a decoding process of an LDPC code, and this will be described below.

A variable node computing process will be described with reference to FIGS. 5 and 6.

A variable node computing process for a low degree in a case that a differential LLR-quantization bit setting scheme is used in a communication system supporting an LDPC code according to an embodiment of the present disclosure will be described with reference to FIG. 5.

Figure 5:
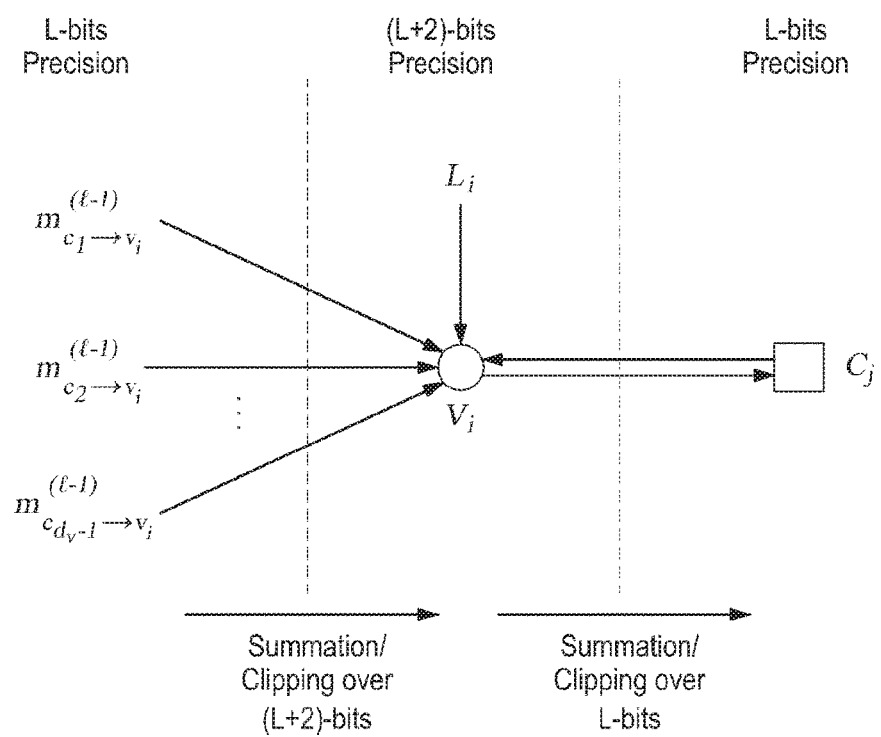
FIG. 5 schematically illustrates a variable node computing process for a low degree in a case that a differential LLR-quantization bit setting scheme is used in a communication system supporting an LDPC code according to an embodiment of the present disclosure.

FIG. 5 schematically illustrates a variable node computing process for a low degree in a case that a differential LLR-quantization bit setting scheme is used in a communication system supporting an LDPC code according to an embodiment of the present disclosure.

Referring to FIG. 5, L indicates the number of quantization bits used for quantizing an LLR, i.e., $\alpha$, and 2 indicates q used for preventing an overflow due to an adding computation. That is, in FIG. 5, q is set to 2 (q=2). In FIG. 5, 1 indicates a repetition count, i indicates a variable node index, and j indicates a check node index.

The number of quantization bits used for quantizing an LLR for a variable node is equal to the number of quantization bits used for quantizing an LLR for an edge, so there is no need for an additional computation in a variable node computing process for a variable node with a low degree and there is no need for modifying the variable node computing process as shown in FIG. 5.

A variable node computing process for a low degree in a case that a differential LLR-quantization bit setting scheme is used in a communication system supporting an LDPC code according to an embodiment of the present disclosure has been described with reference to FIG. 5, and a variable node computing process for a high degree in a case that a differential LLR-quantization bit setting scheme is used in a communication system supporting an LDPC code according to an embodiment of the present disclosure will be described with reference to FIG. 6.

Figure 6:
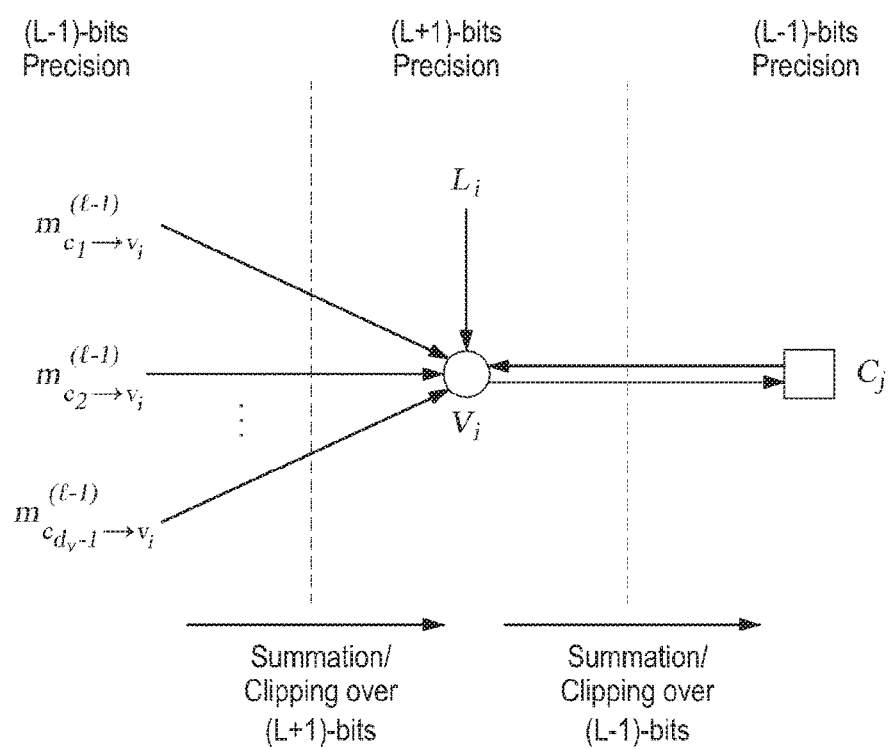
FIG. 6 schematically illustrates a variable node computing process for a high degree in a case that a differential LLR-quantization bit setting scheme is used in a communication system supporting an LDPC code according to an embodiment of the present disclosure.

FIG. 6 schematically illustrates a variable node computing process for a high degree in a case that a differential LLR-quantization bit setting scheme is used in a communication system supporting an LDPC code according to an embodiment of the present disclosure.

Referring to FIG. 6, L−1 denotes the number of quantization bits used for quantizing an LLR, i.e., $\alpha$−1. That is, $\alpha$ is L ($\alpha$=L), and $\delta$ is 1 ($\delta$=1). In FIG. 6, q used for preventing an overflow due to an adding computation is set to 2 (q=2).

In FIG. 6, 1 denotes a repetition count, i denotes a variable node index, and j denotes a check node index.

The number of quantization bits used for quantizing an LLR for a variable node is equal to the number of quantization bits used for quantizing an LLR for an edge, so there is no need for an additional computation in a variable node computing process for a variable node with a high degree and there is no need for modifying the variable node computing process as shown in FIG. 6.

A variable node computing process has been described above, and a check node computing process in a case that a differential LLR-quantization bit setting scheme is used in a communication system supporting an LDPC code according to an embodiment of the present disclosure will be described with reference to FIG. 7.

Figure 7:
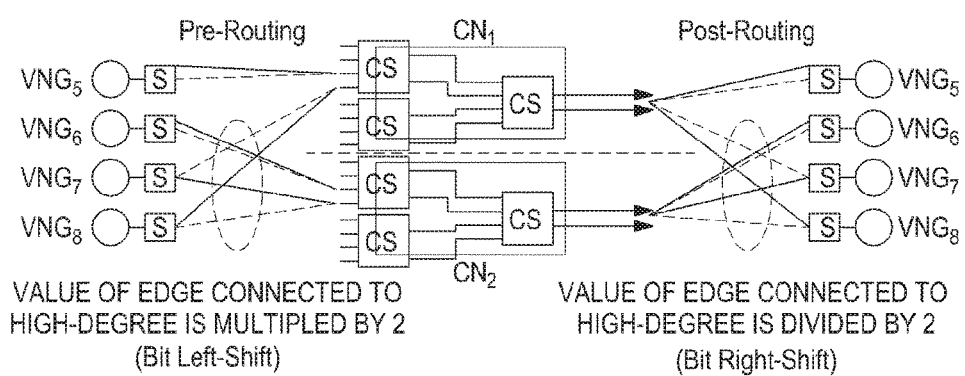
FIG. 7 schematically illustrates a check node computing process in a case that a differential LLR-quantization bit setting scheme is used in a communication system supporting an LDPC code according to an embodiment of the present disclosure.

FIG. 7 schematically illustrates a check node computing process in a case that a differential LLR-quantization bit setting scheme is used in a communication system supporting an LDPC code according to an embodiment of the present disclosure.

Referring to FIG. 7, a check node computing process includes a compare-and-sort computation. So, the check node computing process includes a process of comparing and ordering LLRs quantized using different resolutions, i.e., LLRs quantized using different quantization bits. That is, different types of edges are connected to a check node, so a check node computing process needs to match LLR quantization bit setting for the different types of edges on a check node computation.

At this time, a case that an LLR of a type-1 edge is left-shifted by δ bits can be expressed same as a case that LLRs of each edge are expressed using the same number of LLR quantization bits. Further, an LLR transferred through each edge after a check node computation needs to be expressed using LLR quantization bits which correspond to a type of each edge. For this, an LLR of a type-1 edge is left-shifted by δ bits.

This bit shift computation is very simple compared to other computations performed in a check node process, so it can be regarded that there is almost no complexity added to the check node process due to the bit shift computation.

A check node computing process in a case that the number of LLR quantization bits for a variable node with a high degree is 5 and the number of LLR quantization bits for a variable node with a low degree is 6 is shown in FIG. 7. In FIG. 7, LLRs of edges connected to variable nodes with a high degree are left-shifted by one bit in a case of an LLR input to a check node, and LLRs of edges connected to variable nodes with a high degree are right-shifted by one bit in a case of an LLR output from a check node. That is, LLRs of edges connected to variable nodes with a high degree are increased twice in a case of an LLR input to a check node, and LLRs of edges connected to variable nodes with a high degree are decreased by half in a case of an LLR output from a check node.

A check node computing process in a case that a differential LLR-quantization bit setting scheme is used in a communication system supporting an LDPC code according to an embodiment of the present disclosure has been described with reference to FIG. 7, and an error correction performance of an LDPC code in a case that a differential LLR-quantization bit setting scheme is used in a communication system supporting an LDPC code according to an embodiment of the present disclosure will be described with reference to FIG. 8.

Figure 8:
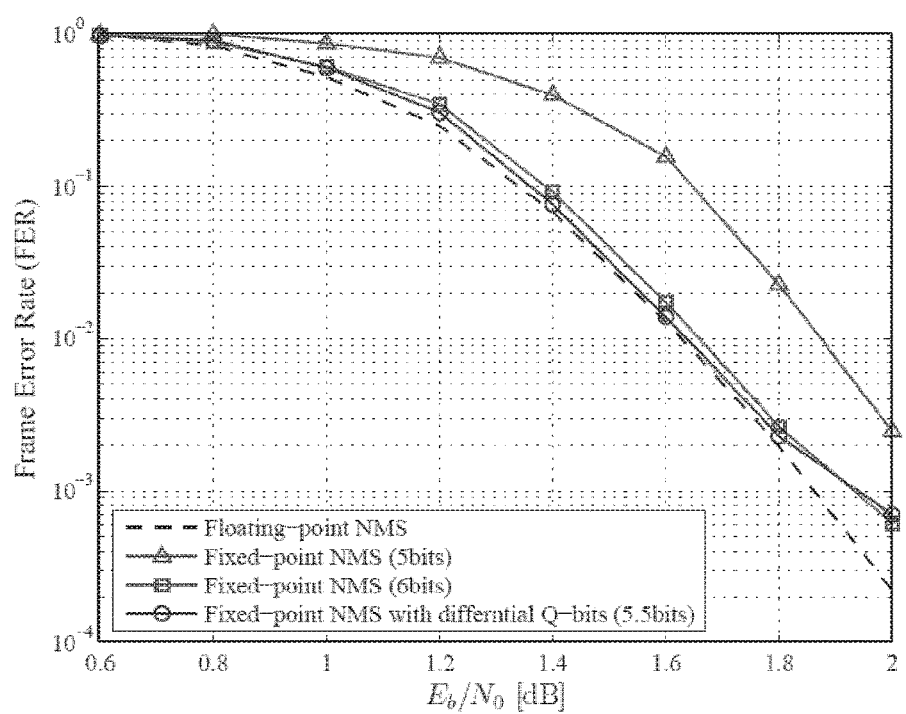
FIG. 8 schematically illustrates an error correction performance of an LDPC code in a case that a differential LLR-quantization bit setting scheme is used in a communication system supporting an LDPC code according to an embodiment of the present disclosure.

FIG. 8 schematically illustrates an error correction performance of an LDPC code in a case that a differential LLR-quantization bit setting scheme is used in a communication system supporting an LDPC code according to an embodiment of the present disclosure.

Referring to FIG. 8, the error correction performance of an LDPC code in FIG. 8 is an error correction performance of a quasi-cyclic (QC) LDPC code which is generated by lifting an LDPC code in FIG. 3 with a factor 48. Specially, an error correction performance of an LDPC code in FIG. 8 is an error correction performance of an LDPC code in a case that it will be assumed that a binary phase shift keying (BPSK) scheme is used as a modulation scheme, and a noise is an additive white Gaussian noise (AWGN).

Further, an error correction performance graph of an LDPC code as shown in FIG. 8 is an error correction performance graph of an LDPC code in a case that an LLR of a type-2 edge is regularly quantized using δ bits in a range from 0 to 10 and an LLR of a type-1 edge is regularly quantized using 5 bits in a range from 0 to 10. The error correction performance graph of the LDPC code as shown in FIG. 8 is an error correction performance graph of an LDPC code in a case that a variable node performs a variable node computation using each of 8 bits and 7 bits according to a type of the variable node, i.e., a degree of the variable node. The error correction performance graph of the LDPC code as shown in FIG. 8 is an error correction performance graph of an LDPC code in a case that an FP-MS scheme is used as a decoding algorithm, for example, in a case that a normalized min-sum scheme of a factor 0.8 is used for correcting a check node computation value.

As shown in FIG. 8, if a differential LLR-quantization bit setting scheme according to an embodiment of the present disclosure is applied, about 5.5 bits are averagely used for expressing an LLR of one edge, so 0.5 bit memory is averagely decreased. It will be understood that an error correction performance is maintained and an error correction performance is enhanced on a specific interval as shown in FIG. 8 even though the number of used bits is decreased.

In FIG. 8, an error correction performance of an LDPC code in a case that a differential LLR-quantization bit setting scheme according to an embodiment of the present disclosure is used is expressed as "Fixed-point NMS with differential Q-bits (5.5 bits)", a vertical axis indicates a frame error rate (FER), and a horizontal axis indicates $E_b/N_0$.

Meanwhile, a performance of an LDPC code in a case of assuming an FP-MS scheme and a regular-quantization is described in FIG. 8. However, a performance of an LDPC code in a case of assuming a fixed-point sum-product (FP-SP) scheme and an irregular-quantization is almost same as the performance of the LDPC code in the case of assuming the FP-MS scheme and the regular-quantization.

A differential LLR-quantization bit setting scheme according to an embodiment of the present disclosure has been described above, and a differential LLR-quantization level setting scheme according to an embodiment of the present disclosure will be described below.

Compared to a differential LLR-quantization bit setting scheme, the differential LLR-quantization level setting scheme can decrease the number of bits used for acquiring the same performance, however, an additional computation can be more complex due to decrease of the number of bits. So, an embodiment of the present disclosure can decrease complexity due to an additional computation by properly setting parameters upon implementing a differential LLR-quantization level setting scheme thereby complexity of the differential LLR-quantization level setting scheme is almost same as complexity of the differential LLR-quantization bit setting scheme.

Meanwhile, in an embodiment of the present disclosure, a differential LLR-quantization bit setting scheme and a differential LLR-quantization level setting scheme are described individually, however, the differential LLR-quantization bit setting scheme and the differential LLR-quantization level setting scheme can be used at the same time. In this case, the smaller number of memories can be used and an error correction performance can be increased compared to a case that the differential LLR-quantization bit setting scheme and the differential LLR-quantization level setting scheme are used individually.

A differential LLR-quantization level setting scheme in a communication system supporting an LDPC code according to an embodiment of the present disclosure will be described with reference to FIGS. 9A and 9B.

Figure 9A:
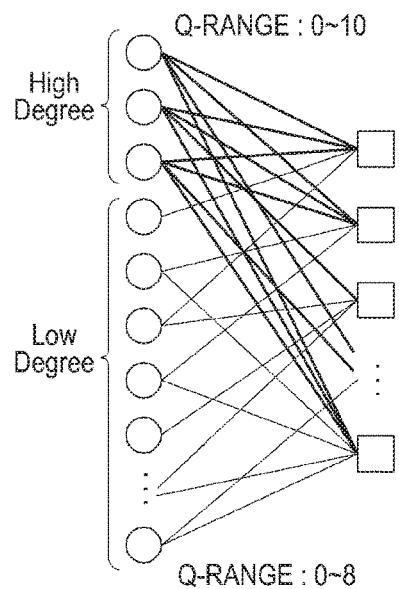
FIGS. 9A and 9B schematically illustrate a differential LLR-quantization level setting scheme in a communication system supporting an LDPC code according to an embodiment of the present disclosure.
Figure 9B:
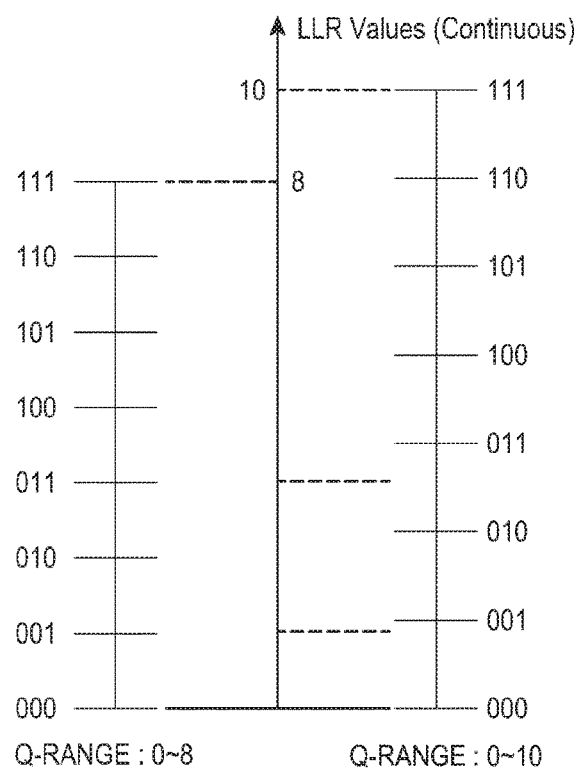

FIGS. 9A and 9B schematically illustrate a differential LLR-quantization level setting scheme in a communication system supporting an LDPC code according to an embodiment of the present disclosure.

Referring to FIGS. 9A and 9B, it will be assumed that the same number of quantization bits, e.g., $\alpha-1$ quantization bits are used regardless of a type of a variable node and an edge in the differential LLR-quantization level setting scheme.

An LLR of a type-1 variable node and a type-1 edge is quantized for a range from 0 to 10, and a number greater than 10 is mapped to a maximum fixed-point value. A convergence speed of a variable node with a high degree is high, so the variable node with the high degree does not affect decoding even though a range of a quantization level for an LLR is wide. A variable node with a high degree sums LLRs transferred from a plurality of edges, so there is a need for considering a wider quantization range. So, as shown in FIGS. 9A and 9B, in an embodiment of the present disclosure, quantization for an LLR of a type-2 node and a type-2 edge is performed using a quantization level range from 0 to 8 and an LLR greater than 8 can be mapped to a maximum fixed-point value.

Here, the number of quantization bits used for quantizing an LLR for a variable node is equal to the number of quantization bits used for quantizing an LLR for an edge, so there is no need for an additional computation in a variable node computing process for a variable node, and there is no need for modifying the variable node computing process.

Meanwhile, different types of edges are connected to a check node, so a check node computing process needs to match the LLR quantization bit setting for the different types of edges on a check node computation, and this can be easily implemented with a bit shift computation and an adding computation.

For example, if a differential LLR-quantization level setting scheme proposed in an embodiment of the present disclosure is applied to a parity check matrix in FIG. 3, an LLR of a type-1 edge is larger than an LLR of a type-2 edge as 1.25 times.

So, there is a need for increasing an LLR of a type-1 edge as 1.25 times before a check node computation, this can be acquired by adding a value which is generated by right-shifting the LLR twice to the LLR. Here, in a process of right-shifting the LLR twice, a value which is below a decimal point is discarded, so an acquired value is not equal to a value which is generated by multiplying the LLR with 1.25 and this difference does not significantly affect an error correction performance of an LDPC code.

A differential LLR-quantization level setting scheme in a communication system supporting an LDPC code according to an embodiment of the present disclosure has been described with reference to FIGS. 9A and 9B, and an error correction performance of an LDPC code in a case that a differential LLR-quantization level setting scheme is used in a communication system supporting an LDPC code according to an embodiment of the present disclosure will be described with reference to FIG. 10.

Figure 10:
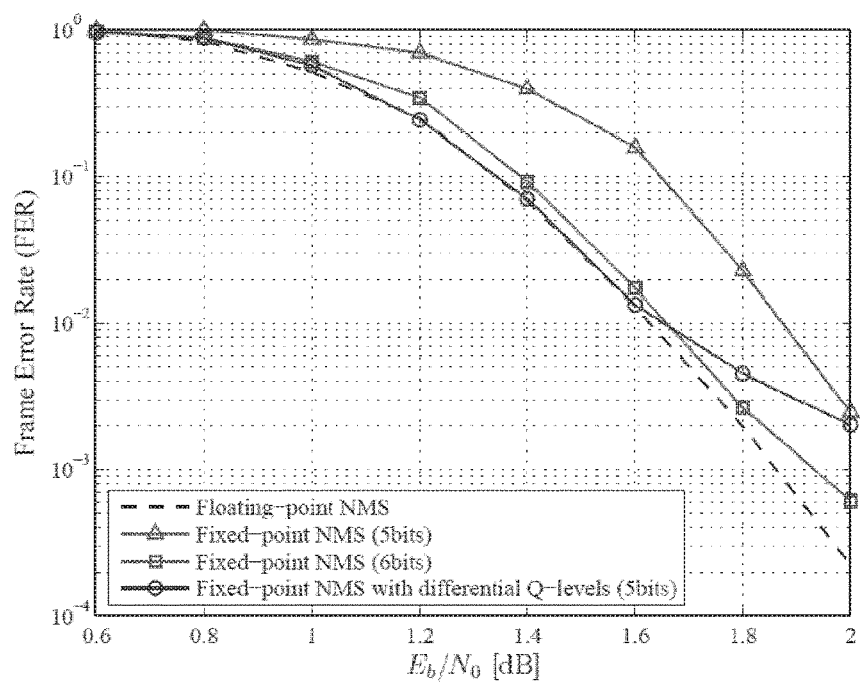
FIG. 10 schematically illustrates an error correction performance of an LDPC code in a case that a differential LLR-quantization level setting scheme is used in a communication system supporting an LDPC code according to an embodiment of the present disclosure.

FIG. 10 schematically illustrates the error correction performance of an LDPC code in a case that a differential LLR-quantization level setting scheme is used in a communication system supporting an LDPC code according to an embodiment of the present disclosure.

Referring to FIG. 10, the error correction performance of an LDPC code in FIG. 10 is the error correction performance of a QC LDPC code which is generated by lifting an LDPC code in FIG. 3 with a factor 48. Specially, an error correction performance of an LDPC code in FIG. 8 is an error correction performance of an LDPC code in a case that it will be assumed that a BPSK scheme is used as a modulation scheme, and a noise is an AWGN.

Further, the error correction performance graph of an LDPC code as shown in FIG. 10 is an error correction performance graph of an LDPC code in a case that LLRs of all edges are regularly quantized using 5 bits, an LLR of a type-2 edge is regularly quantized in a range from 0 to 8, and an LLR of a type-1 edge is regularly quantized in a range from 0 to 10. The error correction performance graph of the LDPC code as shown in FIG. 10 is an error correction performance graph of an LDPC code in a case that a variable node performs a variable node computation using 7 bits according to a type of the variable node. The error correction performance graph of the LDPC code as shown in FIG. 10 is an error correction performance graph of an LDPC code in a case that an FP-MS scheme is used as a decoding algorithm, for example, in a case that a normalized min-sum scheme of a factor 0.8 is used for correcting a check node computation value.

As shown in FIG. 10, if a differential LLR-quantization level setting scheme according to an embodiment of the present disclosure is applied, 5 bits are used for expressing an LLR of one edge, so one bit memory is decreased. It will be understood that an error correction performance is maintained and an error correction performance is enhanced on a specific interval as shown in FIG. 10 even though the number of used bits is decreased. This is why quantization is performed on a variable node using a range of quantization levels from 0 to 8 thereby quantization noise is decreased.

In FIG. 10, an error correction performance of an LDPC code in a case that a differential LLR-quantization bit setting scheme according to an embodiment of the present disclosure is used is expressed as "Fixed-point NMS with differential Q-levels (5 bits)", a vertical axis indicates an FER, and a horizontal axis indicates $E_b/N_0$.

Meanwhile, a performance of an LDPC code in a case of assuming an FP-MS scheme and regular-quantization is described in FIG. 10, however, a differential LLR-quantization bit setting scheme according to an embodiment of the present disclosure has almost same effect in a case of assuming an FP-SP scheme and irregular-quantization.

An error correction performance of an LDPC code in a case that a differential LLR-quantization level setting scheme is used in a communication system supporting an LDPC code according to an embodiment of the present disclosure has been described with reference to FIG. 10, and an inner structure of a signal receiving apparatus in a communication system supporting an LDPC code according to an embodiment of the present disclosure will be described with reference to FIG. 11.

Figure 11:
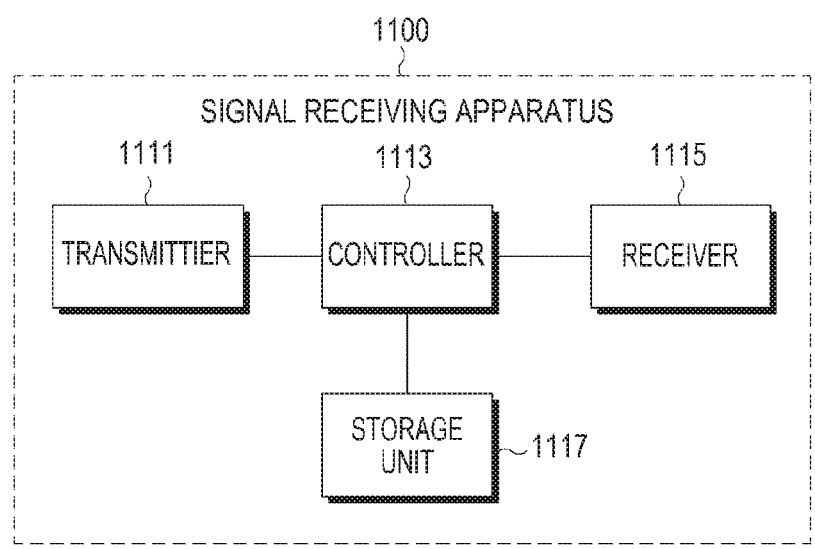
FIG. 11 schematically illustrates an inner structure of a signal receiving apparatus in a communication system supporting an LDPC code according to an embodiment of the present disclosure.

FIG. 11 schematically illustrates an inner structure of a signal receiving apparatus in a communication system supporting an LDPC code according to an embodiment of the present disclosure.

Referring to FIG. 11, a signal receiving apparatus 1100 includes a transmitter 1111, a controller 1113, a receiver 1115, and a storage unit 1117.

The controller 1113 controls the overall operation of the signal receiving apparatus 1100. More particularly, the controller 1113 controls an operation related to a differential LLR-quantization bit setting scheme and a differential LLR-quantization level setting scheme in a communication system supporting an LDPC code according to an embodiment of the present disclosure. The differential LLR-quantization bit setting scheme and the differential LLR-quantization level setting scheme in the communication system supporting the LDPC code according to an embodiment of the present disclosure have been described with FIGS. 3 to 10, and a detailed description thereof will be omitted herein.

The transmitter 1111 transmits various signals and various messages to other devices included in the communication system, e.g., a signal transmitting apparatus and/or the like under a control of the controller 1113. The various signals and various messages transmitted in the transmitter 1111 have been described with reference to FIGS. 3 to 10, and a detailed description thereof will be omitted herein.

The receiver 1115 receives various signals and various messages from other devices included in the communication system, e.g., a signal transmitting apparatus and/or the like under a control of the controller 1113. The various signals and various messages received in the receiver 1115 have been described with reference to FIGS. 3 to 10, and a detailed description thereof will be omitted herein.

The storage unit 1117 stores various programs, various data, and/or the like related to the differential LLR-quantization bit setting scheme and the differential LLR-quantization level setting scheme in the communication system supporting the LDPC code according to an embodiment of the present disclosure under a control of the controller 1113.

The storage unit 1117 stores various signals and various messages which are received by the receiver 1115 from the other devices.

While the transmitter 1111, the controller 1113, the receiver 1115, and the storage unit 1117 are described in the signal receiving apparatus 1100 as separate units, it is to be understood that this is merely for convenience of description. In other words, two or more of the transmitter 1111, the controller 1113, the receiver 1115, and the storage unit 1117 can be incorporated into a single unit.

The signal receiving apparatus 1100 can be implemented with one or more processors.

As is apparent from the foregoing description, an embodiment of the present disclosure enables to receive a signal in a communication system supporting an LDPC code.

An embodiment of the present disclosure enables to receive a signal by considering a degree of a variable node in a communication system supporting an LDPC code.

An embodiment of the present disclosure enables to receive a signal by considering the number of quantization bits used when detecting an LLR in a communication system supporting an LDPC code.

An embodiment of the present disclosure enables to receive a signal by considering a range of a quantization level used when detecting an LLR in a communication system supporting an LDPC code.

An embodiment of the present disclosure enables to receive a signal thereby decreasing a hardware mounted area in a communication system supporting an LDPC code.

An embodiment of the present disclosure enables to receive a signal thereby decreasing power consumption in a communication system supporting an LDPC code.

An embodiment of the present disclosure enables to receive a signal thereby increasing a length of an implementable LDPC code without increasing a hardware mounted area in a communication system supporting an LDPC code.

Certain aspects of the present disclosure can also be embodied as computer readable code on a non-transitory computer readable recording medium. A non-transitory computer readable recording medium is any data storage device that can store data, which can be thereafter read by a computer system. Examples of the non-transitory computer readable recording medium include read only memory (ROM), random access memory (RAM), CD-ROMs, magnetic tapes, floppy disks, optical data storage devices, and carrier waves (such as data transmission through the Internet). The non-transitory computer readable recording medium can also be distributed over network coupled computer systems so that the computer readable code is stored and executed in a distributed fashion. In addition, functional programs, code, and code segments for accomplishing the present disclosure can be easily construed by programmers skilled in the art to which the present disclosure pertains.

It can be appreciated that a method and apparatus according to an embodiment of the present disclosure can be implemented by hardware, software and/or a combination thereof. The software can be stored in a non-volatile storage, for example, an erasable or re-writable ROM, a memory, for example, a RAM, a memory chip, a memory device, or a memory integrated circuit (IC), or an optically or magnetically recordable non-transitory machine-readable (e.g., computer-readable), storage medium (e.g., a compact disk (CD), a digital video disc (DVD), a magnetic disk, a magnetic tape, and/or the like). A method and apparatus according to an embodiment of the present disclosure can be implemented by a computer or a mobile terminal that includes a controller and a memory, and the memory can be an example of a non-transitory machine-readable (e.g., computer-readable), storage medium suitable to store a program or programs including instructions for implementing various embodiments of the present disclosure.

The present disclosure can include a program including code for implementing the apparatus and method as defined by the appended claims, and a non-transitory machine-readable (e.g., computer-readable), storage medium storing the program. The program can be electronically transferred via any media, such as communication signals, which are transmitted through wired and/or wireless connections, and the present disclosure can include their equivalents.

An apparatus according to an embodiment of the present disclosure can receive the program from a program providing device which is connected to the apparatus via a wire or a wireless and store the program. The program providing device can include a memory for storing instructions which instruct to perform a content protect method which has been already installed, information necessary for the content protect method, and the like, a communication unit for performing a wired or a wireless communication with a graphic processing device, and a controller for transmitting a related program to a transmitting/receiving device based on a request of the graphic processing device or automatically transmitting the related program to the transmitting/receiving device.

Although the present disclosure has been described with an exemplary embodiment, various changes and modifications can be suggested to one skilled in the art. It is intended that the present disclosure encompass such changes and modifications as fall within the scope of the appended claims.

What is claimed is:

1. A method for performing an error correction operation on a codeword transmitted from a transmitting apparatus by a receiving apparatus including a memory storing bits processed in a decoding scheme, a transceiver, and a processor in a communication system supporting a low density parity check (LDPC) code, the method comprising:
   receiving, by the transceiver, the codeword from a transmitting apparatus;
   decoding, by the processor, the codeword by using the decoding scheme to detect reliability information of each of codeword bits included in the codeword, and by using a number of quantization bits and a range of a quantization level; and
   performing, by the processor, the error correction operation based on the reliability information,
   wherein the number of quantization bits and the range of a quantization level are determined based on a degree of a node on a bipartite graph of the LDPC code,
   wherein the node includes at least one of a variable node or a check node, and
   wherein the number of the quantization bits is inversely proportional to the degree of the variable node,
   wherein, if the degree of the node is greater than a threshold value, a number of bits used for detecting reliability information of the node is greater than a number of quantization bits used for detecting reliability information of a node with a degree equal to or less than the threshold value.

2. The method of claim 1, further comprising:
   if the node is a variable node, performing a bit shift computation on reliability information of the check node in the bipartite graph corresponding to a difference between the number of quantization bits used for detecting the reliability information of the node with degree greater than the threshold value and the number of quantization bits used for detecting the reliability information of the node with the degree equal to or less than the threshold value.

3. The method of claim 1, wherein the reliability information is a log-likelihood-ratio (LLR).

4. The method of claim 1, wherein, if the degree of the node is greater than a threshold value, a range of a quantization level used for detecting reliability information of the node is greater than a quantization level used for detecting reliability information of a node with a degree equal to or less than the threshold value.

5. The method of claim 4, further comprising:
   if the node is a variable node, performing a bit shift computation and an adding computation on reliability information of a check node in the bipartite graph in the decoding scheme corresponding to a difference between the quantization level used for detecting the reliability information of the node with degree greater than the threshold value and the quantization level used for detecting the reliability information of the node with degree equal to or less than the threshold value.

6. The method of claim 4, wherein the reliability information is a log-likelihood-ratio (LLR).

7. The method of claim 1, wherein the decoding scheme is based on a fixed-point scheme.

8. The method of claim 1, wherein the range of the quantization level is directly proportional the degree of the node.

9. The method of claim 1, further comprising:
   determining the variable node as a first type-variable node, if the degree of the variable node is equal to a maximum value;
   determining the variable node as a second type-variable node, if the degree of the variable node is less than the maximum value; and
   setting a number of quantization bits of the first type-variable node to be lower by a first integer value than a number of quantization bits of the second type-variable node.

10. The method of claim 9, further comprising:
    increasing the number of quantization bits of the first type-variable node by a second integer value, for preventing an overflow caused by a computation process for the variable node.

11. A receiving apparatus, for performing an error correction operation on a codeword transmitted from a transmitting apparatus, in a communication system supporting a low density parity check (LDPC) code, the receiving apparatus comprising:
    a memory configured to store bits processed in a decoding scheme;
    a transceiver; and
    a processor configured to:
      control the transceiver to receive the codeword from a transmitting apparatus,
      decode the codeword by using the decoding scheme to detect reliability information of each of codeword bits included in the codeword, and by using a number of quantization bits and a range of a quantization level, and
      perform the error correction operation based on the reliability information,
    wherein the number of quantization bits and the range of a quantization level are determined based on a degree of a node on a bipartite graph of the LDPC code,
    wherein the node includes at least one of a variable node or a check node, and
    wherein the number of the quantization bits is inversely proportional to the degree of the variable node,
    wherein, if the degree of the node is greater than a threshold value, a number of bits used for detecting reliability information of the node is greater than a number of quantization bits used for detecting reliability information of a node with a degree equal to or less than the threshold value.

12. The receiving apparatus of claim 11, wherein the processor further configured to:
    if the node is a variable node, perform a bit shift computation on reliability information of a check node on the bipartite graph corresponding to a difference between the number of quantization bits used for detecting the reliability information of the node with degree greater than the threshold value and the number of quantization bits used for detecting the reliability information of the node with the degree equal to or less than the threshold value.

13. The receiving apparatus of claim 11, wherein the reliability information is a log-likelihood-ratio (LLR).

14. The receiving apparatus of claim 11, wherein, if the degree of the node is greater than a threshold value, a range of a quantization level used for detecting reliability information of the node is greater than a quantization level used for detecting reliability information of a node with a degree equal to or less than the threshold value.

15. The receiving apparatus of claim 14, wherein the processor further configured to:
if the node is a variable node, perform a bit shift computation and an adding computation on reliability information of a check node on the bipartite graph in the decoding scheme corresponding to a difference between the quantization level used for detecting the reliability information of the node with degree greater than the threshold value and the quantization level used for detecting the reliability information of the node with degree equal to or less than the threshold value.

16. The receiving apparatus of claim 14, wherein the reliability information is a log-likelihood-ratio (LLR).

17. The receiving apparatus of claim 11, wherein the decoding scheme is based on a fixed-point scheme.

18. The receiving apparatus of claim 11,
wherein the range of the quantization level is directly proportional the degree of the node.

* * * * *